US011750325B2

(12) United States Patent
Savoj et al.

(10) Patent No.: US 11,750,325 B2
(45) Date of Patent: Sep. 5, 2023

(54) SELF REFERENCED SINGLE-ENDED CHIP TO CHIP COMMUNICATION

(71) Applicant: Apple Inc., Cupertino, CA (US)

(72) Inventors: Jafar Savoj, Sunnyvale, CA (US); Praveen R. Singh, Sunnyvale, CA (US); Brian S. Leibowitz, San Francisco, CA (US); Emerson S. Fang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 184 days.

(21) Appl. No.: 16/933,449

(22) Filed: Jul. 20, 2020

(65) Prior Publication Data
US 2021/0099252 A1  Apr. 1, 2021

Related U.S. Application Data

(63) Continuation of application No. 16/253,100, filed on Jan. 21, 2019, now Pat. No. 10,756,849.

(51) Int. Cl.
*H04L 1/02* (2006.01)
*H03K 19/0175* (2006.01)
(Continued)

(52) U.S. Cl.
CPC .......... *H04L 1/02* (2013.01); *H03K 19/0175* (2013.01); *H04L 25/0272* (2013.01); *H04L 25/062* (2013.01); *H04L 2025/03363* (2013.01)

(58) Field of Classification Search
CPC ..... H04L 1/02; H04L 25/0272; H04L 25/062; H03K 19/0175
(Continued)

(56) References Cited

U.S. PATENT DOCUMENTS 6,992,932 B2   1/2006 Cohen
7,742,339 B2   6/2010 Rizel et al.
(Continued)

OTHER PUBLICATIONS

Zhou et al., "Error-Correcting Schemes with Dynamic Thresholds in Nonvolatile Memories", 2011 IEEE International Symposium on Information Theory Proceedings, Sep. 2011, pp. 2109-2113.
(Continued)

*Primary Examiner* — Leila Malek
(74) *Attorney, Agent, or Firm* — Robert C. Kowert; Kowert, Hood, Munyon, Rankin & Goetzel, P.C.

(57) ABSTRACT

A system and method for efficiently transporting data in a computing system are contemplated. In various embodiments, a computing system includes a source, a destination and multiple lanes between them for transporting data. Multiple receivers in the destination has a respective termination resistor connected to a single integrating capacitor, which provides a reference voltage to the multiple receivers. The receivers reconstruct the received data by comparing the corresponding input signals to the reference voltage. The source includes a table storing code words. The source maps a generated data word to a code word, which is sent to the destination. The destination maps the received code word to the data word. The values of the code words are selected to maintain a nearly same number of Boolean ones on the multiple lanes over time as a number of Boolean zeroes.

19 Claims, 6 Drawing Sheets

(51) Int. Cl.
*H04L 25/02* (2006.01)
*H04L 25/06* (2006.01)
*H04L 25/03* (2006.01)

(58) Field of Classification Search
USPC .................................................. 375/260
See application file for complete search history.

(56) References Cited

U.S. PATENT DOCUMENTS

| | | | |
|---|---|---|---|
| 7,864,588 B2 | 1/2011 | Betser | |
| 8,000,161 B2 | 8/2011 | Stan et al. | |
| 8,059,439 B2 | 11/2011 | Park | |
| 8,245,094 B2 | 8/2012 | Jiang et al. | |
| 8,456,911 B2 | 6/2013 | Yuan et al. | |
| 8,582,381 B2 | 11/2013 | Oowada et al. | |
| 8,856,611 B2 | 10/2014 | Wu et al. | |
| 8,943,263 B2 | 1/2015 | Frost et al. | |
| 9,136,015 B2 | 9/2015 | Anholt et al. | |
| 10,756,849 B2 | 8/2020 | Savoj et al. | |
| 2006/0132335 A1* | 6/2006 | Kojima | H04L 25/14 341/58 |
| 2008/0204298 A1* | 8/2008 | Yamaji | H03M 1/123 341/155 |
| 2011/0246710 A1 | 10/2011 | Strope | |
| 2011/0267019 A1 | 11/2011 | Krishnamurthy et al. | |
| 2011/0276990 A1* | 11/2011 | Higashino | G11B 20/10296 |
| 2012/0254686 A1 | 10/2012 | Esumi et al. | |
| 2012/0314499 A1 | 12/2012 | Yuan et al. | |
| 2014/0208181 A1 | 7/2014 | Daniel et al. | |
| 2017/0170870 A1* | 6/2017 | Chen | H04B 3/32 |
| 2020/0028767 A1* | 1/2020 | Yoshida | H03M 13/3761 |

OTHER PUBLICATIONS

International Search Report and Written Opinion in International Application No. PCT/US2020/014266, dated Apr. 6, 2020, 9 pages.
Office Action in German Patent Application No. 112020000461.9, dated Mar. 1, 2022, 24 pages.
First Examination Report in Indian Patent Application No. 202117032448, dated Mar. 9, 2022, 8 pages.
Notification of the First Office Action in Chinese Patent Application No. 202080010283.1, dated Apr. 25, 2022, 10 pages.

* cited by examiner

SELF REFERENCED SINGLE-ENDED CHIP TO CHIP COMMUNICATION

CROSS REFERENCE TO RELATED APPLICATIONS

This application is a continuation of U.S. patent application Ser. No. 16/253,100, entitled "SELF REFERENCED SINGLE-ENDED CHIP TO CHIP COMMUNICATION", filed Jan. 21, 2019, the entirety of which is incorporated herein by reference.

BACKGROUND

Technical Field

Embodiments described herein are related to the field of integrated circuit implementation, and more particularly to transporting data in a computing system.

DESCRIPTION OF THE RELATED ART

Systems on chips (SoCs) are becoming increasingly complex with ever increasing numbers of agents within a typical SoC and available endpoints. Examples of the agents are multimedia engines, digital signal processors (DSPs), and processing units, each with one or more of a central processing unit (CPU) and a data parallel processor like a graphics processing unit (GPU). Endpoints include input/output (I/O) peripheral devices such as memory devices, communication interfaces such as radio communication interfaces, speakers, displays and so on. Data is shared among the different agents of the SoC and among the available endpoints.

Typically, an interconnect transports transactions from a source, such as an agent, to a destination such as another agent or an endpoint. In some cases, the interconnect is a communication fabric. In some cases, the source and the destination are within a same die, but in other cases, they are on separate dies. When transferring transactions between a source and a destination, electrical signals are sent on multiple, parallel metal traces. Transmitters in the source send the electrical signals across the parallel metal traces to be received by receivers in the destination. Many times, a reference signal is generated and sent to multiple receivers. The receivers include sampling circuitry for reconstructing the received input signal by comparing the received input signal to the received reference voltage.

The power supply used to generate the signals at the transmitter and transported over the metal traces is different from the power supply used to generate the reference voltage on the receiver side. Power supply variations, cross-coupling capacitance, and so forth cause variations in the transported signals which are not experienced by the reference voltage. Therefore, when the sampling circuitry reconstructs the received signals, the latency increases or data corruption occurs.

In view of the above, efficient methods for transporting data in a computing system are desired.

SUMMARY OF THE EMBODIMENTS

Systems and methods for efficiently transporting data in a computing system are contemplated. In various embodiments, a computing system includes a source, a destination and multiple lanes between them for transporting data. The source includes one or more processors for generating data words to send on the multiple lanes to the destination. The source also includes multiple transmitters for driving data on the multiple lanes, whereas, the destination includes multiple receivers for receiving data from the multiple lanes. Each of the receivers in the destination has a respective termination resistor connected to a single integrating capacitor. The integrating capacitor provides a reference voltage to the plurality of receivers. The receivers send the received data to sampling circuitry for reconstructing the received input signals corresponding to the received data by comparing the received input signals to the reference voltage.

The power supply used to generate the signals at the transmitters on the source and transported over the metal traces of the multiple lanes is different from the power supply used by circuitry in the destination. Power supply variations, cross-coupling capacitance, and so forth cause variations in the transported signals which are not typically experienced by the reference voltage. However, the topology in the destination using the integrating capacitor makes the reference voltage dependent on the power supply in the source. In order to maintain a particular voltage on the integrating capacitor, particular patterns are used for the signals transported on the multiple lanes. Therefore, data words generated by the source are mapped to code words, which are transported on the multiple lanes. The code words are mapped to data words at the destination.

The source includes a table with each entry storing a code word. In some designs, the code words are larger than the data words. For example, in one case, the data words are 5 bits in size and the code words are 6 bits in size. In other examples, other numbers of bits is used for the data word and the code word. Therefore, to transport 40 bits of data between the source and the destination, 48 metal traces are used. The values of the code words are selected to maintain a nearly same number of Boolean ones on the multiple lanes over time as a number of Boolean zeroes. Therefore, the reference voltage provided by the integrating capacitor at the destination maintains a nearly constant voltage over time.

When an agent in the source generates data to send to the destination, the data is partitioned into multiple data words. In one example, the 40 bits of data is partitioned into eight 5-bit data words. In some designs, there are eight copies of the table to allow for parallel lookup for each of the data words. Control logic in the source searches the table using the generated data word and retrieves a 6-bit code word different from the 5-bit data word from the table based on the search.

The control logic sends the code word to the multiple transmitters for driving the code word on the multiple lanes to the receivers in the destination. When the code word is received by the destination, control logic in the destination maps the 6-bit code word to the 5-bit data word. For example, the destination also includes tables with entries storing data words. The tables are accessed with the received code word to obtain the corresponding data word.

These and other embodiments will be further appreciated upon reference to the following description and drawings.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Figure 1:
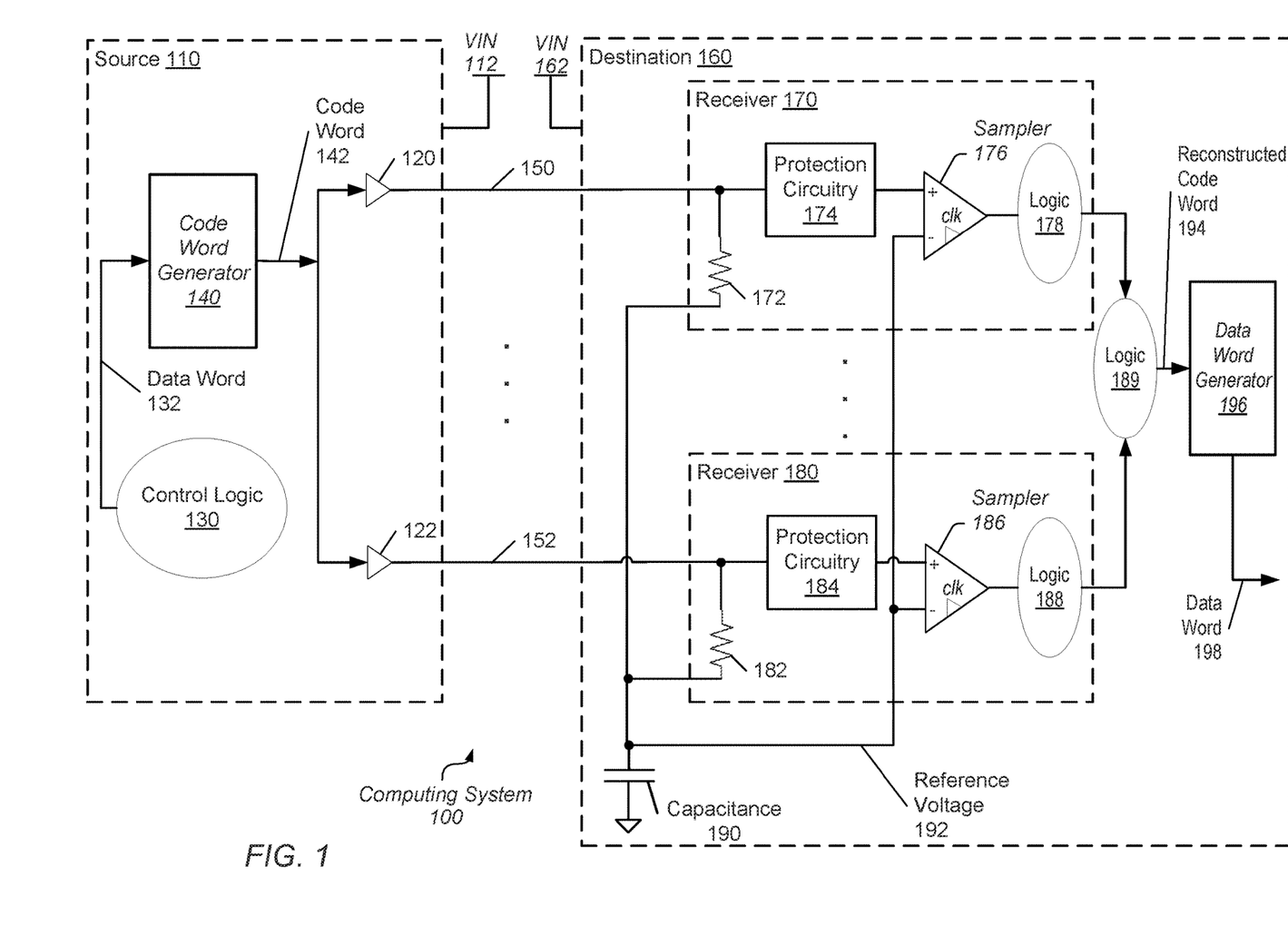
FIG. 1 illustrates a block diagram of an embodiment of a computing system with a communication bus between a source and a destination.

Referring to FIG. 1, a generalized block diagram of one embodiment of a computing system 100 with a communication bus between a source and a destination is shown. In various embodiments, the computing system 100 has a communication bus between the source 110 and the destination 160. In an embodiment, the communication bus includes the parallel transmission lines 150-152. In the illustrated embodiment, the source 110 sends information as electrical signals on the parallel transmission lines 150-152 to the destination 160. Source 110 includes transmitters 120-122 for sending the electrical signals on the parallel transmission lines 150-152 (communication bus), and the destination 160 includes receivers 170-180 for receiving the electrical signals from parallel transmission lines 150-152.

The source 110 includes one or more agents, which are not shown for ease of illustration, for generating data to send on the transmission lines 150-152. Examples of agents are multimedia engines, application specific integrated circuits (ASICs), digital signal processors (DSPs), and processing units. Processing units include one or more of a central processing unit (CPU) and a data parallel processor like a graphics processing unit (GPU). Control logic 130 represents any combination of control logic within one or more agents and control logic external to the agents interfacing with the transmitters 120-122. The functionality of each of the control logic 130 and the code word generator 140 is implemented with one or more of hardware, such as circuitry with combinatorial logic and sequential storage elements, software and a combination of hardware and software.

Control logic 130 is configured to obtain one or more data words 132. In some cases, control logic 130 generates the data word 132 as shown in the illustrated embodiment. In some cases, control logic 130 receives the data word 132. In any case, code word generator 140 generates code word 142 based on data word 132. The source 110 sends the code word 142 as parallel data across parallel transmission lines 150-152 via transmitters 120-122. For example, in various embodiments, each one of the parallel transmission lines 150 is used to transfer one bit of the code word 142. In an embodiment, control logic 130 performs a lookup of a table using the data word 132 to obtain the code word 142. In another embodiment, code word generator 140 receives the data word 132 and includes lookup logic for performing the lookup of the table to obtain the code word 142. Source 110 uses the table as a mapping table in many cases. In other embodiments, code word generator 140 uses an encoder or other combinatorial logic to generate the code word 142 from the data word 132. In yet other embodiments, code word generator 140 uses software or a combination of software and hardware to generate the code word 142 from the data word 132.

The functionality of the code word generator 140 is included in any of a variety of components such as agents and endpoints. As described earlier, examples of agents are multimedia engines, digital signal processors (DSPs), and processing units, each with one or more of a central processing unit (CPU) and a data parallel processor like a graphics processing unit (GPU). Endpoints include input/output (I/O) peripheral devices and other types of devices, each with a communication interface such as interface logic to a bus. Therefore, the code word 142 is sent from the code word generator 140 to the transmitters 120-122 by one of a variety of ways such as direct signal lines, a queue with arbitration logic for accessing a bus, or other. The code word 142 is driven on the transmission lines 150-152 by the transmitters 120-122. In various embodiments, the code word 142 is driven on the transmission lines 150-152 by the transmitters 120-122 in place of the data word 132 in order to drive particular data patterns, which provide particular electrical patterns on the transmission lines 150-152.

Phase lock loops (PLLs) for generating a clock signal, interrupt controllers, memory access interfaces, power managers, particular processing units and logic, and so forth are not shown in source 110 and the destination 160 for ease of illustration. The signals sent from transmitters 120-122 to receivers 170-180 via the parallel transmission lines 150-152 are single-ended data signals. The term "single-ended signal" is defined as an electric signal which is transmitted using a single signal conductor. For example, receiver 170 receives a single-ended signal from transmitter 120 via transmission line 150, which is a single signal conductor. In contrast to using single-ended data signals, sending information with differential data signals uses more lines and more pins. A reference signal is not generated and sent to multiple pins (or multiple receivers) when differential data signals are used. As is known in the art, differential signaling generally provides better noise immunity than single-ended signaling. However, the use of differential signaling comes at the added cost of extra pins and extra traces.

In some cases, the source 110 and the destination 160 are within a same die, but in other cases, they are on separate dies. In some designs, the source 110 and the destination 160 are located within a bridge of a respective processing unit. It is noted that the terms "pin," "port," "terminal," and "node" are used interchangeably herein. It is also noted that the term "transmission line" may also be referred to as a "lane" and the term "bus" may also be referred to as a "channel." A lane may also be referred to as a "trace" or a "wire." In various designs, a link includes multiple lanes. Lanes 150-152 are constructed from a variety of suitable metal sources during semiconductor fabrication and surrounded by a variety of any suitable insulating material.

Circuitry in the source 110 uses the power supply voltage VIN 112 to generate electrical signals and transport these electrical signals over the metal traces of lanes 150-152. Circuitry in the destination 160 uses the power supply voltage VIN 162 to generate electrical signals. In some cases, the voltage levels of the power supply voltage VIN 112 and the power supply voltage VIN 162 is the same, whereas, in other cases, they are different. Power supply variations, cross-coupling capacitance, electromagnetic interference, crosstalk and other undesired effects may cause variations in the transported signals on lanes 150-152 which are not typically experienced by the reference voltage used by the destination 160. However, the topology in the destination 160 uses the integrating capacitor 190 to both generate the reference voltage 192 and make the reference voltage 192 based on the power supply voltage 112 of the source 110. In other words, the integrating capacitor 190 makes the reference voltage 192 based on the average signal voltage transported on lanes 150-152.

In order to maintain a particular voltage on the integrating capacitor 190, particular patterns are used for the signals transported on the lanes 150-152. For example, data words generated by the source 110, such as data word 132, are mapped to one or more code words such as code word 142. The one or more code words, such as code word 142, are transported on the lanes 150-152. As described earlier, the transported electrical signals on lanes 150-152 experience variations based on a variety of factors such as cross-coupling capacitance and so on. Therefore, one or more electrical signals representing the one or more bits of the transported code word 142 are degraded when received by the destination 160. The degraded version of the code word 142 is received by the termination resistors 172-182, the samplers 176-186, and the protection circuitry 174-184. In one example, VIN 112 has a value of 0.8 volts (V), so the code word 142 sent by the transmitters 120-122 uses the voltage 0.8V as a Boolean logic high value. Due to power supply variations, cross-coupling capacitance, and so forth, the degraded version of the code word 142 received by the destination 160 on the parallel lanes 150-152 may have a Boolean logic high value represented by 0.55V instead of 0.8V, in one example. The code word 142 is reconstructed on a bit-wise basis by the samplers 176-186 and logic 178-188. For example, the samplers 176-186 compare the electrical signals received on lanes 150-152 on a bit-wise basis to the reference voltage 192. The results of the comparisons are used to determine whether a received electrical signal on a given one of the lanes 150-152 is a Boolean logic high value or a Boolean logic low value. When a bit of the received, degraded code word 142 is determined to be a Boolean logic high value, the output of logic 178 uses the value of 0.8V for representing the value versus the received, degraded value of 0.55V. Following, logic 189 reconstructs the parallel reconstructed code word 194, which is remapped to data word 198 by data word generator 196 of the destination 160. Data word 198 has the same value as data word 132 generated by the source 110. However, reconstruction of the received data used the code word 142, rather than the data word 132.

The metal traces of lanes 150-152 may experience transmission line effects, such as distributed inductance, capacitance and resistance throughout the line length. To reduce signal reflection, the ends of the lanes 150-152 at the receivers 170-180 are terminated using the characteristic impedances of the lanes 150-152. The receivers 170-180 may use impedance-matching circuitry, including but not limited to, the termination resistors 172-182, which prevents reflection on the lanes 150-152. Reflection at any impedance change point on lanes 150-152 results in signal distortion, signal ringing and so forth. In some embodiments, the receivers 170-180 also use one or more inductors along with the termination resistors 172-182 for impedance matching and to reduce capacitance on the input pins of the receivers 170-180.

Each of the termination resistors 172-182 receives a respective one of the input signals from lanes 150-152 on a first end and receives the termination voltage on a second end. Here, the termination voltage is not a ground reference voltage, but rather, it is the reference voltage 192. Accordingly, the current-resistance (IR) drops across the termination resistors 172-182 are dependent on the reference voltage 192. A fixed reference voltage does not track the common mode noise on the input signals received on lanes 150-152. The common mode current-resistance (IR) drops across termination resistors 172-182 send the common mode voltages of the input signals received on lanes 150-152 to the protection circuitry blocks 174-184.

In some embodiments, as described below, the reference voltage 192 is generated to be one half of the supply voltage used by the receivers 170-180 in the destination 160 such as the supply voltage VIN 162. In some designs, the capacitor 190 is a lumped capacitance. In other designs, the capacitor 190 is a distributed capacitance. The capacitor 190 is also referred to as an "integrating capacitor," since the reference voltage 192 on one end of the capacitor 190 is based on the connections to each of the termination resistors 172-182 in the receivers 170-180. Any change in the reference voltage 192 from its expected value affects the comparison performed by the samplers 176-186.

In some embodiments, the receivers 170 and 180 send the received electrical signals to protection circuitry 174 and 184 to protect against electrostatic discharge. The protection circuitry blocks 174-184 include electrostatic discharge (ESD) protection circuitry such as one of a variety of diode clamping circuits. Examples of these circuits include the human body model (HBM) circuitry and the charged device model (CDM) circuitry. The outputs of the protection circuitry blocks 174-184 are sent to sampling circuitry such as samplers 176-186. Samplers 176 and 186 reconstruct the received electrical signals by comparing the electrical signals to the reference voltage 192.

In some embodiments, samplers 176-186 are clocked comparators where the input clock signal is not shown for ease of illustration. In an embodiment, each of the samplers 176-186 receives the output voltage of a respective one of the protection circuitry blocks 174-184 on a positive terminal and receive the reference voltage 192 on a negative terminal. In various embodiments, each of the samplers 176-186 is a clocked sense amplifier although a clock input signal is not shown. In some designs, the circuitry for the samplers 176-186 and a sequential element is combined, rather than the circuitry is in separate elements such as a sequential element in logic blocks 178-188.

In various embodiments, the reconstructed signals in receivers 170-180 are sent to logic 189, which combines the reconstructed signals to form the parallel reconstructed data word 194. In some embodiments, logic 189 includes a data word generator 196, which includes the exact reverse mappings of the code word generator 140. In other embodiments, the data word generator is located externally from the logic 189. The data word generator 196 receives the reconstructed code word 194, which has a same value as the code word 142. Based on the reconstructed code word 194, the data word generator 196 generates the data word 198, which is equal to the data word 132. In one example, each bit position of the data word 198 has a same binary value as a corresponding bit position of the data word 132. The functionality of the data word generator 196 is included in decoding logic or a decoder block within one of a variety of components.

A received input bit stream on a given one of the parallel lanes 150-152 is a sequence of bits received over time on the given one of the parallel lanes 150-152. In an embodiment, a period of time between a rising edge and a falling edge on the output of a given one of the protection circuitry blocks 174-184 is used to determine a number of Boolean high values (binary '1') in a corresponding input bit stream. A period of time between a falling edge and a rising edge on the output of the protection circuitry blocks 174-184 is used to determine a number of Boolean low values (binary '0') in an input bit stream. In an embodiment, one or more of sampler 176 and a sequential element in logic 178 send a stream of Boolean values to a deserializer (not shown) in logic 178, which generates a sequence of parallel code words and sends the code words to other logic blocks and/or arithmetic logic units. As described earlier, in various embodiments, logic 178 sends the code words to a data word generator to generate data words based on the received code words. A data word generated by the data word generator matches the data word 132 received from the source 110.

As described earlier, the termination voltage for each of the termination resistors 172-182 is not a ground reference voltage, but rather, it is the reference voltage 192. A fixed reference voltage does not track the common mode noise on the input signals received on the parallel lanes 150-152. The samplers 176 and 186 reconstruct the noisy electrical signals received from the parallel lanes 150-152 by comparing these received, noisy electrical signals to the reference voltage 192. Typically, the reference voltage 192 is half of the voltage range of signals on lanes 150-152. By comparing the received, noisy electrical signals to half of the voltage range of signals on lanes 150-152, the samplers 176 and 186 determine whether a given received electrical signal is a Boolean one value or a Boolean zero value. In order to generate the reference voltage 192 to be one half of the voltage range of signals on lanes 150-152, the electrical signals corresponding to the code word 142 on lanes 150-152 follow a particular pattern. For example, the number of Boolean ones matches or approximately matches the number of Boolean zeroes on code word 142 at any time. In some embodiments, the "logical disparity" of the code word 142 is a difference between half of the size of the code word 142 and the number of Boolean zeroes in the code word 142. For example, if the code word 142 is a 4-bit code word with two Boolean zeroes and two Boolean ones, then the logical disparity is zero. In this example, half of the size of the 4-bit code word 142 is two bits and there are two Boolean zeroes in the code word 142, and 2−2=0. However, if the 4-bit code word 142 has three Boolean zeroes, then the logical disparity is negative one. In this example, half of the size of the 4-bit code word 142 is two bits and there are three Boolean zeroes in the code word 142, and 2−3=−1.

In a similar manner as the above example, a 4-bit code word 142 with one Boolean zero has a logical disparity of one. The code words are selected by prioritizing code words with the smallest logical disparity. For example, for a 5-bit data word 132 and a 6-bit code word 142, there are 2^6 candidates, or 64 candidates, for selecting code words from 6'b 000 000 to 6'b 111 111, where "6'b" represents a notation specifying six binary digits. From these 64 6-bit candidates, 32 candidates are selected to represent the 32 possible 5-bit data words to send on lanes 150-152. The 64 candidates include 20 candidates with a logical disparity of zero. In other words, the 64 candidates include 20 candidates with a same number of Boolean zeroes (3 Boolean zeroes) as the number of Boolean ones (3 Boolean ones). However, 20 is less than 32, so 12 more candidates are needed. Again, the code words are selected by prioritizing code words with the smallest logical disparity. The 64 candidates include 15 candidates with a logical disparity of one, and 15 candidates with a logical disparity of negative one. Twelve candidates are selected from these 30 available candidates to complete the 32 6-bit code words used by the code word generator 140.

Another definition for the logical disparity uses a count of the number of Boolean ones in the code word 142. Other definitions for the logical disparity use a different fraction of the size of the code word 142 when a different fraction other than one half of the power supply voltage 162 is used to define the reference voltage 192. A variety of sizes for the code word 142 and the data word 132 are possible and contemplated. For example, in some embodiments, the data word 132 has a size of 5 bits and the size of the code word 142 is 6 bits.

In other examples, the data word 132 has a size of 7 bits and the size of the code word 142 is 8 bits. In yet other examples, the sizes are different by more than one bit. For example, in some embodiments, the data word 132 has a size of 5 bits and the size of the code word 142 is 8 bits. In an example, to transport 40 bits of data between two functional blocks, such as two processing units, 48 metal traces are used when the data word 132 has a size of 5 bits and the size of the code word 142 is 6 bits, and the source 110 and the destination 160 are instantiated eight times. Other combinations of the size of the data word 132, the size of the code word 142 and the number of instantiations a version of the source 110 and the destination 160 are possible and contemplated. For example, a first communication bus has a size of the data word 132 of 5 bits and a size of the code word 142 of 6 bits. Therefore, the parallel transmission lines 150-152 for the first communication bus includes six metal traces. A second communication bus has a size of the data word 132 of 5 bits and a size of the code word 142 of 8 bits. Therefore, the parallel transmission lines 150-152 for the second communication bus includes eight metal traces. A third communication bus may have a same number of metal traces as one of the first communication bus and the second communication bus. Alternatively, the third communication bus has a different number of metal traces than each of the first communication bus and the second communication bus.

Figure 2:
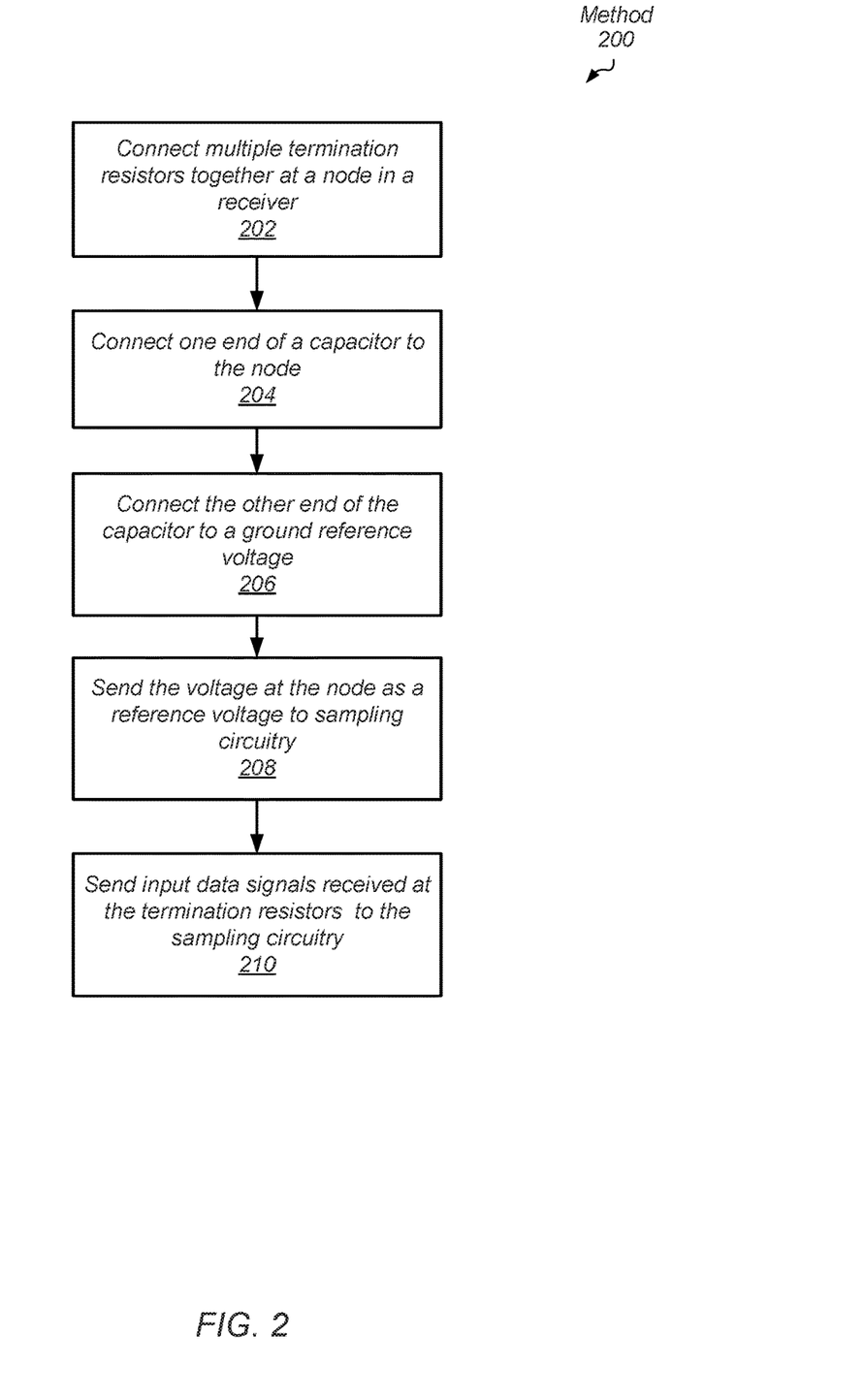
FIG. 2 illustrates a flow diagram of an embodiment of a method for efficiently transporting data in a computing system.

Turning now to FIG. 2, a generalized flow diagram of one embodiment of a method 200 for efficiently transporting data in a computing system is shown. For purposes of discussion, the steps in this embodiment (as well as for FIGS. 5-6) are shown in sequential order. However, in other embodiments some steps may occur in a different order than shown, some steps may be performed concurrently, some steps may be combined with other steps, and some steps may be absent.

Multiple termination resistors are connected together at a node in a receiver (block 202). The termination resistors are used for impedance matching on the ends of transmission lines transporting single-ended data signals. Rather than connect the termination resistors to the ground reference voltage, they are connected to one another. One end of a capacitor is connected to the node (block 204). The other end of the capacitor is connected to a ground reference voltage (block 206).

The voltage at the node is sent as a reference voltage to sampling circuitry (block 208). The data signals received at the termination resistors are sent to the sampling circuitry (block 208). Each instantiation of the sampling circuitry compares the electrical signal received on one of the multiple lanes to the reference voltage to determine the Boolean value of the electrical signal.

Figure 3:
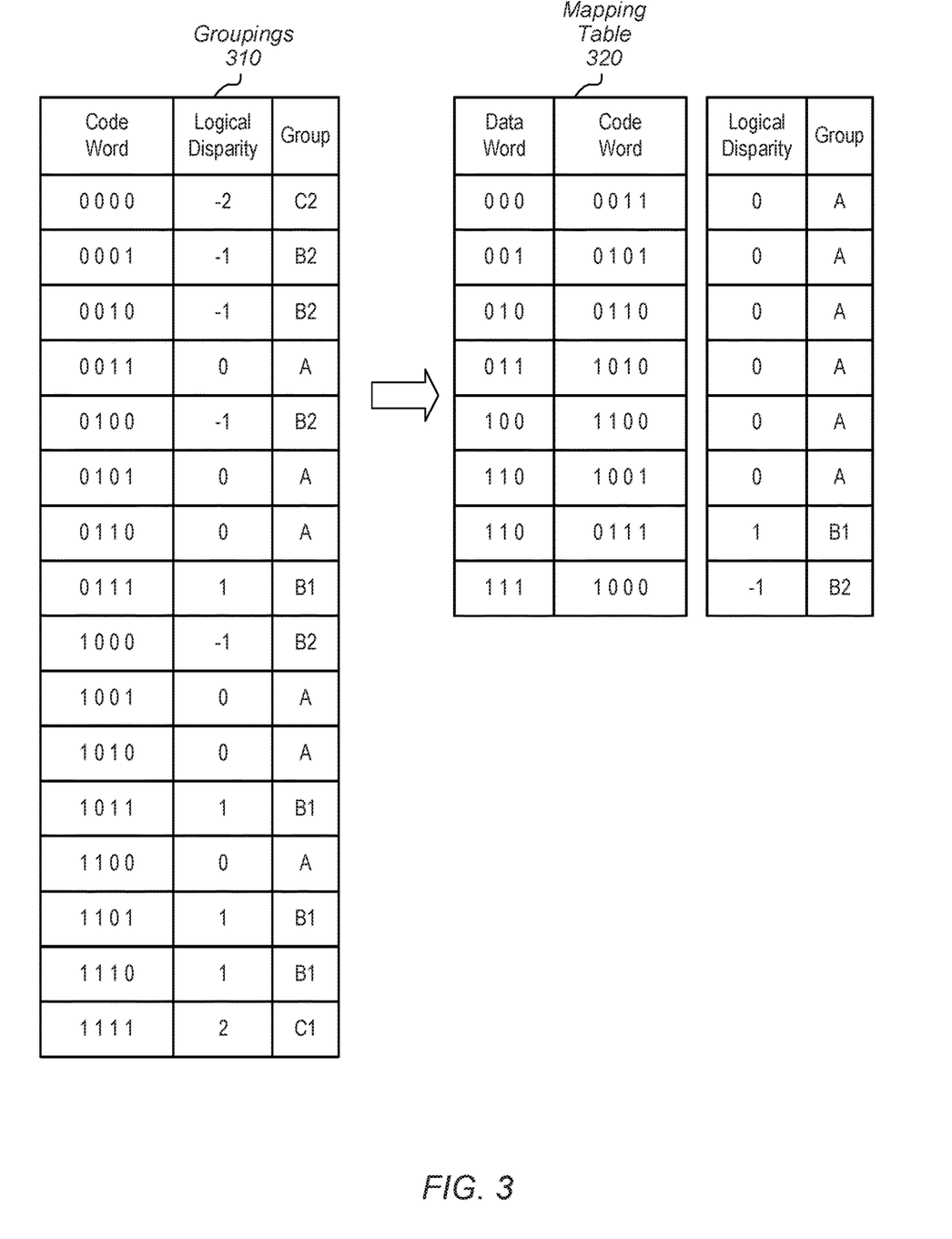
FIG. 3 illustrates a block diagram of an embodiment of mappings between data words and code words.

Referring to FIG. 3, tables of one embodiment of code word groupings 310 and mapping table 320 are shown. The mapping table 320 includes an entry for each of the possible data words generated by a source, which is to be processed at a destination. In various embodiments, the source and the destination are functional blocks communicating with one another. In the illustrated embodiment, data words have a size of 3 bits and code words have a size of 4 bits. However, these sizes are shown for ease of illustration, and in other embodiments, other sizes for the data words and code words are possible and contemplated. The source has processing logic that generates one of the 3-bit data words shown in the mapping table 320. However, instead of sending a 3-bit data word, the source sends a 4-bit code word stored in the mapping table 320. It is noted that although the mapping table 320 is shown, in other embodiments, the mapping table 320 is representative of the mappings used by encoding logic, such as combinatorial logic, software or a combination, used to generate code words from data words.

The mapping table 320 has eight entries for the eight possible combinations of the 3-bit data word. There are 16 possible combinations for the 4-bit code word, so there are 16 code word candidates. Eight of the sixteen combinations are selected for storage in the mapping table 320 while eight are unused. The groupings 310 show how eight code words are selected from the sixteen candidates. In the mappings 310, next to each of the code word candidates is a logical disparity value for that particular code word candidate. As described earlier, one definition of the logical disparity of the code word is a difference between half of the size of the code word and the number of Boolean zeroes in the code word.

The fourth code word candidate is 4'b0011 and contains two Boolean zeroes and two Boolean ones. Half of the size of the 4-bit code word is two bits and there are two Boolean zeroes in the fourth code word candidate, and 2−2=0. This code word candidate is placed in Group A based on the logical disparity of 0. Similarly, each of the sixth candidate (4'b0101), the seventh candidate (4'b0110), the tenth candidate (4'b1001), the eleventh candidate (4'b1010), and thirteenth candidate (4'b1100) has a logical disparity of 0 and is placed in Group A.

When the destination includes receivers with a topology as illustrated earlier for communication bus (of FIG. 1) with the termination resistors connected together through a capacitor in order to generate a reference voltage, this topology benefits from particular patterns transported on the transmission lines. For example, in order to generate the reference voltage to be one half of the supply voltage, the electrical signals corresponding to the code word on the transmission lines have a number of Boolean ones matching the number of Boolean zeroes. Group A in the groupings 310 have this particular pattern.

Ideally, each selected code word candidate to be stored in the mapping table 320 is from Group A. However, Group A only has six candidates when eight candidates are needed in the mapping table 320. Therefore, two more candidates are selected from other groups preferably with a logical disparity close to zero. The eighth code word candidate is 4'b0111 and contains one Boolean zero and three Boolean ones. Half of the size of the 4-bit code word is two bits and there is one Boolean zero in the eighth code word candidate, and 2−1=1. The eighth code word candidate is placed in Group B1 based on the logical disparity of 1. The twelfth candidate (4'b1011) and the fifteenth candidate (4'b1110) are also placed in Group B1.

The second code word candidate is 4'b0001, and its logical disparity is −1, since half of the size of the 4-bit code word minus the number of Boolean zeroes in the code word is 2−3=−1. The second code word candidate is placed in Group B2 based on the logical disparity of −1. The third candidate (4'b0010), the fifth candidate (4'b0100), and the ninth candidate (4'b1000) are also placed in Group B2. The sixteenth code word candidate is 4'b1111, and its logical disparity is 2, since half of the size of the 4-bit code word minus the number of Boolean zeroes in the code word is 2−0=2. The first code word candidate is placed in Group C1 based on the logical disparity of 2. The first code word candidate is 4'b0000, and its logical disparity is −2, since half of the size of the 4-bit code word minus the number of Boolean zeroes in the code word is 2−4=−2. The first code word candidate is placed in Group C2 based on the logical disparity of −2.

The groups B1 and B2 have logical disparity values closer to zero than groups C1 and C2. To remain balanced over time, one of the two remaining candidates selected as code words for the mapping table 320 is from the group B1, whereas the other candidate is from the group B2. In one design, the eighth candidate code word (4'b0111) is selected from group B1 and the fifth candidate code word (4'b1000) is selected from group B2. As shown, the first six data words from 3'b000 to 3'b110 are mapped to a code word from group A, whereas, the data word 3'b110 is mapped to a code word from group B1 and the data word 3'b111 is mapped to a code word from group B2.

Any time a data word is generated, the data word is used as an index to perform a lookup in the mapping table 320 and the corresponding code word is sent on transmission lines to a receiver. At receivers in the destination, a mapping table or decoding logic is used to map the received code word to the data word originally generated at the source. The logical disparities and the groups are shown for each entry of the mapping table 320, although these values are not stored in the mapping table 320. The mapping table 320 shows one example of mappings. In other examples, one or more of the last two data words (3'b110 and 3'b111) are mapped to group A, whereas one or more of the previous six data words are mapped to group B1 or B2. In yet other examples, other code word candidates are selected from groups B1 and B2.

It is noted that if the processing logic in the source kept generating the seventh data word (3'b110), then a code word with the logical disparity of 1 from group B1 is sent on the transmission lines to the destination. Similarly, if the processing logic in the source kept generating the eighth data word (3'b111), then a code word with the logical disparity of −1 from group B2 is sent on the transmission lines to the destination. Therefore, over time, the data received on the transmission lines by the receivers are not maintaining the balanced particular pattern of a same number of Boolean zeroes as the number of Boolean ones. In other words, the received data are not providing a long-term logical disparity of zero, which is used to maintain a reference voltage in the receiver at half of the supply voltage. To further balance the received data, another type of mapping table is used.

Figure 4:
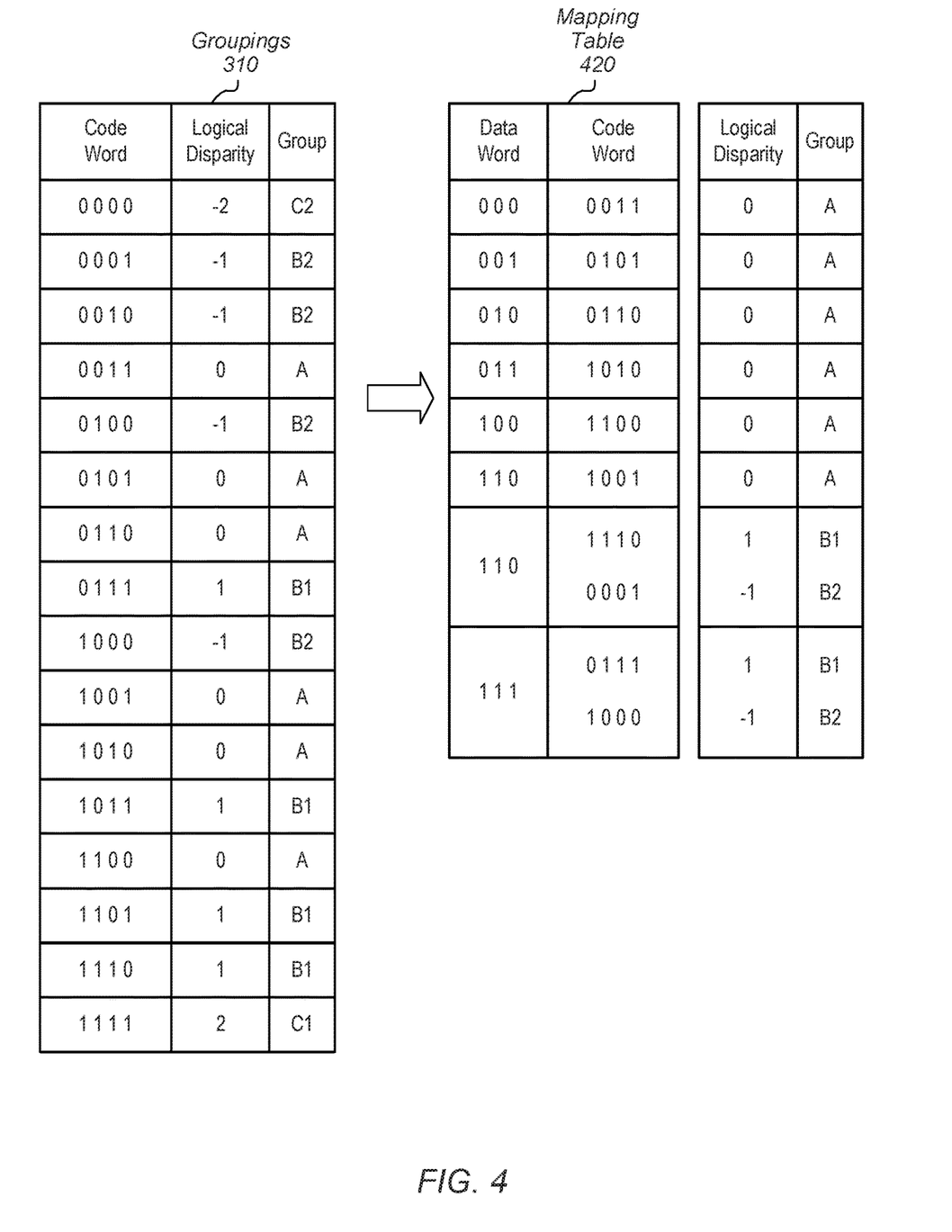
FIG. 4 illustrates a block diagram of another embodiment of mappings between data words and code words.

Turning now to FIG. 4, a generalized block diagram of one embodiment of code word groupings 310 and mapping table 420 is shown. It is noted that although the mapping table 420 is shown, in other embodiments, the mapping table 420 is representative of the mappings used by encoding logic, such as combinatorial logic, software or a combination, used to generate code words from data words. The code word groupings 310 are identical to the previously described groupings. The first six data words are mapped in the mapping table 420 in a same manner as used in the previous mapping table 320. However, here, the seventh data word (3'b110) is mapped to two code words. The first code word (4'b1110) is from group B1 and the second code word (4'b0001) is from group B2. In a similar manner, the eighth data word (3'b111) is mapped to two code words. The first code word (4'b0111) is from group B1 and the second code word (4'b1000) is from group B2.

When the processing logic in the source generates the seventh data word (3'b110), the transmitters in the source send either a first code word (4'b1110) from group B1 with a logical disparity of 1, or a second code word (4'b0001) from group B2 with a logical disparity of −1. In a similar manner, when the processing logic in the source generates the eighth data word (3'b111), the transmitters in the source send either a first code word (4'b0111) from group B1 with a logical disparity of 1, or a second code word (4'b1000) from group B2 with a logical disparity of −1.

In one embodiment, control logic in the source selects the code word to send for the seventh data word (3'b110) opposite from the code word previously selected. So if the code word 4'b1110 from group B1 was previously selected for the seventh data word (3'b110), then the next time the processing logic generates the seventh data word (3'b110), the control logic selects the code word 4'b0001 from group B2 in the mapping table 420. So if the sequence of generated data words is 3'b110, 3'b110, 3'b110 and 3'b110, then the sequence of transmitted code words is 4'b1110, 4'b0001, 4'b1110 and 4'b0001. This sequence of transmitted code words has a sequence of logic disparities of 1, −1, 1 and −1, which provides a long-term logical disparity of 0.

Figure 5:
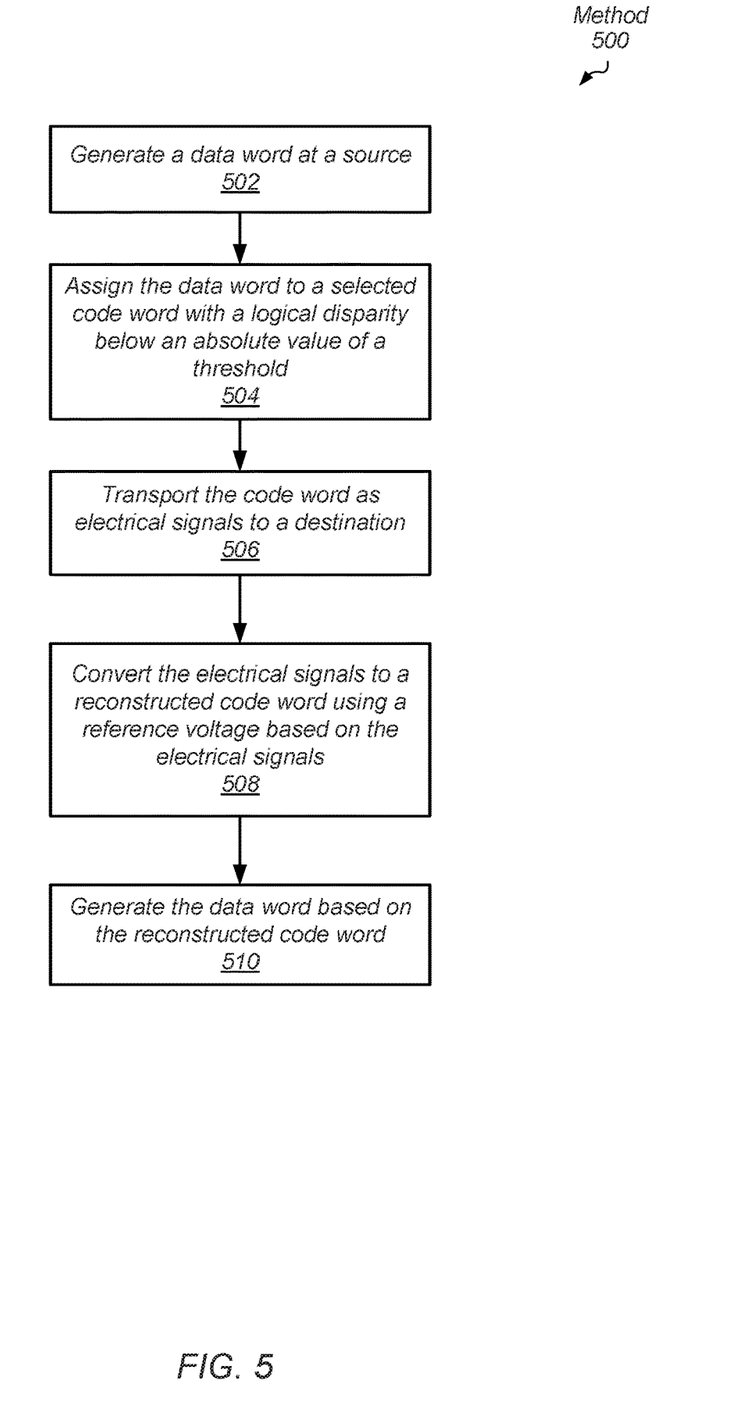
FIG. 5 illustrates a flow diagram of an embodiment of a method for efficiently transporting data in a computing system.

Turning now to FIG. 5, a generalized flow diagram of one embodiment of a method 500 for efficiently transporting data in a computing system is shown. A data word is generated at a source (block 502). In multiple examples, the data word is a subset of data to send between the source and a destination. The data word is mapped to a selected code word with a logical disparity below an absolute value of a threshold (block 504). For example, a threshold of 1 is used in some designs, which allows a code word with a logical disparity of 1 or −1 to be selected. As shown earlier, when the data words have a size of 3 bits and the code words have a size of 4 bits, six of the eight data words are mapped to a code word from group A with a logical disparity of 0. The remaining two data words are mapped to code words from groups B1 and B2 with logical disparities of 1 and −1.

In a similar manner, when the data words have a size of 5 bits and the code words have a size of 6 bits, there are 64 code words from which to select for mapping the 32 data words. There are 20 code words in group A with a logical disparity of 0. There are 15 code words in group B1 with a logical disparity of 1 and 15 code words in group B2 with a logical disparity of −1. For the 12 remaining data words not yet mapped, in one design, 12 code words from the 15 code words in group B1 are selected and 12 code words from the 15 code words in group B2 are selected. Each of these 12 remaining data words is mapped to two code words. The particular code word selected is based on the previously selected code word in order to alternate between group B1 and group B2 as shown earlier for the mapping table 420 (of FIG. 4).

In another design, the data words have a size of 7 bits and the code words have a size of 8 bits. Therefore, there are 256 code words from which to select for mapping the 128 data words. There are 70 code words in group A with a logical disparity of 0, which leaves 58 data words to still map since 128−70=58. There are 56 code words in group B1 with a logical disparity of 1 and 56 code words in group B2 with a logical disparity of −1. For the 58 remaining data words not yet mapped, in one design, all 56 code words from the group B1 are selected and all 56 code words from the group B2 are selected. Each of these 56 remaining data words is mapped to two code words. The particular code word selected during data transmission is based on the previously selected code word in order to alternate between group B1 and group B2. There are still 2 data words to map since 128−70−56=2.

There are 28 code words in group C1 with a logical disparity of 2 and 28 code words in group C2 with a logical disparity of −2. For the 2 remaining data words not yet mapped, in one design, 2 code words of the 28 code words from the group C1 are selected and 2 code words of the 28 code words from the group C2 are selected. Each of these 2 remaining data words is mapped to two code words. The particular code word selected during data transmission is based on the previously selected code word in order to alternate between group C1 and group C2. Therefore, the absolute value of the threshold is 2 in this case, rather than 1.

The selected code word is sent as electrical signals to a destination (block 506). In various embodiments, the computing system has a communication bus between the source and the destination. In an embodiment, the communication bus includes multiple parallel transmission lines. In various embodiments, each one of the parallel transmission lines transfers one bit of the selected code word. The electrical signals received at the destination are converted to the code word using a reference voltage based on the electrical signals (block 508). For example, the transmitters at the source send the selected code word as single-ended data signals on the transmission lines. The receivers at the destination sample these electrical signals with sampling circuitry, which compares the received electrical signals to a reference voltage. As described earlier, the transported electrical signals on the multiple parallel transmission lanes experience variations based on a variety of factors such as cross-coupling capacitance and so on. Therefore, one or more electrical signals representing the one or more bits of the transported code word are degraded when received by the destination. Sampling the received electrical signals with the sampling circuitry of the destination begins the signal reconstruction process. In some embodiments, the reference voltage used for sampling is generated on a node of a capacitor, which is connected to each termination resistor connected to the transmission lines used to transmit the electrical signals corresponding to the selected code word. This topology is illustrated in the communication bus 100 (of FIG. 1).

Logic of the destination generates the data word based on the reconstructed code word (block 510). For example, after the sampling circuitry converts the received electrical signals to the reconstructed code word, a data word generator generates the data word based on the reconstructed code word. In one embodiment, the data word generator performs a lookup of a mapping table using the reconstructed code word. The mapping table has the exact mappings of the mapping table used at the source, except the mappings are in reverse. The data word assigned to the reconstructed code word is read from the mapping table and sent to one or more data processing blocks at the destination. In other embodiments, the logic of the destination generates the data word based on the reconstructed code word using decoding logic.

Figure 6:
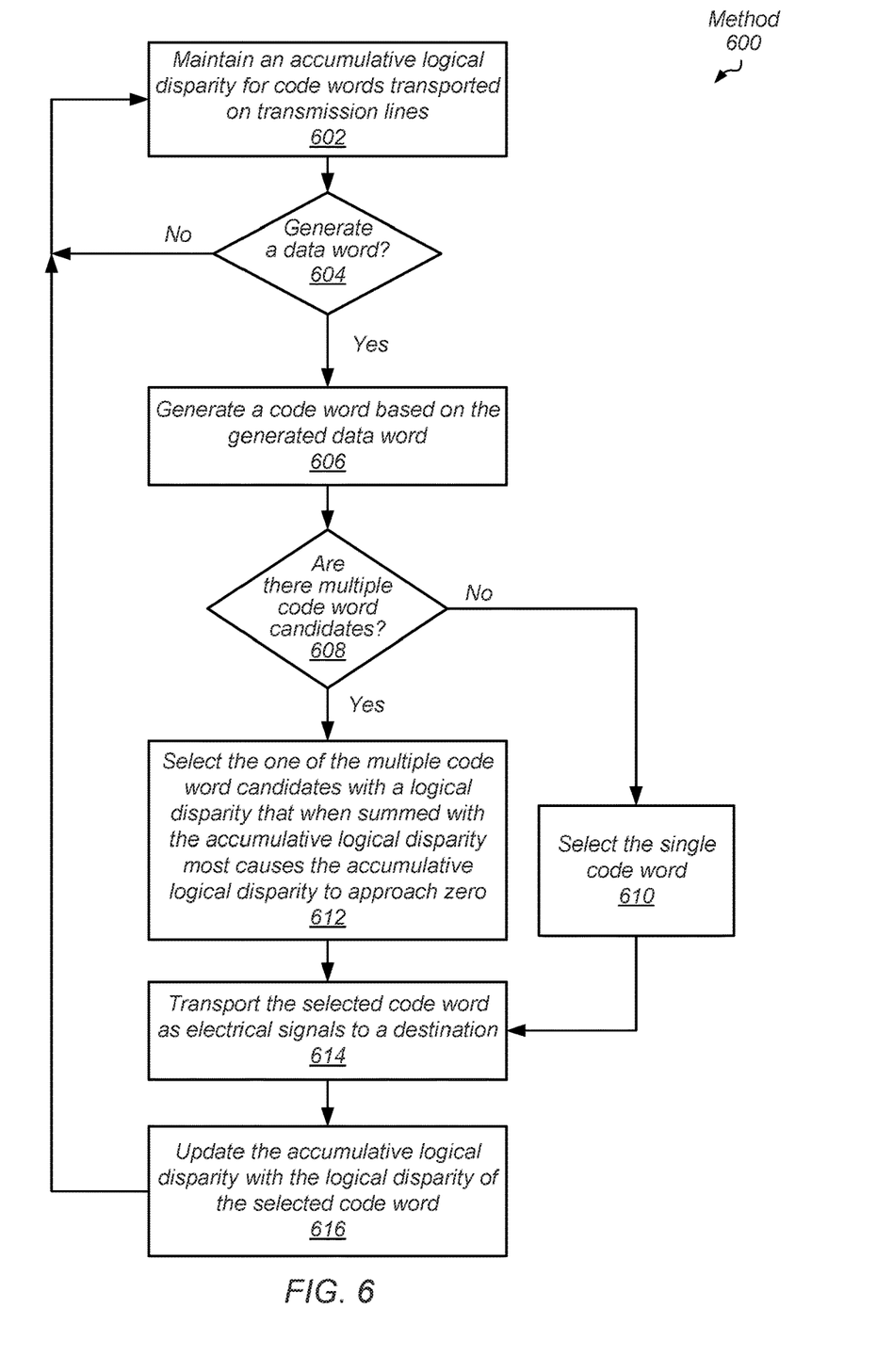
FIG. 6 illustrates a flow diagram of an embodiment of a method for efficiently transporting data in a computing system.

Turning now to FIG. 6, a generalized flow diagram of one embodiment of a method 600 for efficiently transporting data in a computing system is shown. An accumulative logical disparity for code words transported on transmission lines is maintained (block 602). For example, if a code word from group B1 with a logical disparity of 1 is selected for data transmission followed by a code word from group C2 with a logical disparity of −2, then the accumulative logical disparity is −1, since 1+(−2)=−1. The current value of the accumulative logical disparity is stored in one of a variety of storage elements.

Returning briefly to the example of data words with a size of 7 bits and code words with a size of 8 bits, it is possible that an accumulative logical disparity strays from 0. If toggling between individual groups is done, such as between groups B1 and B2, and separately between groups C1 and C2, then it is possible to select a code word from group B1 followed by selecting a code word from group C1. These selections provide an accumulative logical disparity of 3, since 1+2=3. Therefore, an improved selection scheme by the control logic in the source considers the accumulative logical disparity. Whenever the accumulative logical disparity is negative, and the next code word is not from group A with a logical disparity of 0, then the control logic selects a code word with a positive logical disparity. Likewise, when the accumulative logical disparity is positive, and the next code word is not from group A with a logical disparity of 0, then the control logic selects a code word with a negative logical disparity.

If a data word is not generated ("no" branch of the conditional block 604), then control flow of method 600 returns to block 602 where the accumulative logical disparity is maintained. In this case, the current value is maintained. If a data word is generated ("yes" branch of the conditional block 604), then a code word is generated based on the generated data word (block 606). For example, a mapping table is searched based on the generated data word. In other examples, encoding logic generates the code word based on the generated data word.

If there is a single code word candidate for the generated data word ("no" branch of the conditional block 608), then the single code word is selected (block 610). However, if there are multiple code word candidates for the generated data word ("no" branch of the conditional block 608), then one of the multiple code word candidates is selected, which has a logical disparity that when summed with the accumulative logical disparity most causes the accumulative logical disparity to approach zero (block 612). Again, if the accumulative logical disparity is already positive, then the code word of the multiple code words with a negative logical disparity is selected. Otherwise, if the accumulative logical disparity is currently negative, then the code word of the multiple code words with a positive logical disparity is selected.

The selected code word is transported as electrical signals to a destination (block 614). For example, single-ended signal transmission is used. The accumulative logical disparity is updated with the logical disparity of the selected code word (block 616). Afterward, control flow of method 600 returns to block 602 where the accumulative logical disparity is maintained.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus comprising:
   circuitry configured to:
   receive a first plurality of signals via an interface at a first point in time;
   generate a first sequence of bits based on the first plurality of signals and an average voltage level of the first plurality of signals; and
   receive a second plurality of signals via the interface at a second point in time;
   generate a second sequence of bits, with at least one value different from the first sequence of bits, based on the second plurality of signals and an average voltage level of the second plurality of signals;
   wherein the first sequence of bits and the second sequence of bits represent a same data word.

2. The apparatus as recited in claim 1, wherein the interface receives the first plurality of signals as a plurality of single-ended data signals on a plurality of transmission lines.

3. The apparatus as recited in claim 2, wherein a first voltage level representing a Boolean logic high value for the first plurality of signals is less than a second voltage level representing a Boolean logic high value for the second plurality of signals.

4. The apparatus as recited in claim 3, wherein the circuitry is further configured to determine whether a given signal of the first plurality of signals is a Boolean logic high value or a Boolean logic low value by comparing the given signal to the average voltage level of the first plurality of signals.

5. The apparatus as recited in claim 2, wherein the circuitry is further configured to receive the plurality of single-ended data signals on an integrating capacitor via a plurality of termination resistors.

6. The apparatus as recited in claim 1, wherein the circuitry is further configured to generate the data word based on the first sequence of bits.

7. The apparatus as recited in claim 6, wherein:
the data word matches bits used by a transmitter to generate the first plurality of signals; and
each of the first plurality of signals and the second plurality of signals corresponds to a different accumulative logical disparity.

8. A method comprising:
receiving, from source circuitry at destination circuitry, a first plurality of signals;
generating a first sequence of bits based on the first plurality of signals and an average voltage level of the first plurality of signals;
receiving, from the source circuitry at the destination circuitry, a second plurality of signals at a second point in time; and
generating a second sequence of bits, with at least one value different from the first sequence of bits, based on the second plurality of signals and an average voltage level of the second plurality of signals;
wherein the first sequence of bits and the second sequence of bits represent a same data word.

9. The method as recited in claim 8, wherein the first plurality of signals are single-ended data signals.

10. The method as recited in claim 9, wherein a first voltage level representing a Boolean logic high value for the first plurality of signals is less than a second voltage level representing a Boolean logic high value for the second plurality of signals.

11. The method as recited in claim 10, further comprising determining, by the destination circuitry, whether a given signal of the first plurality of signals is a Boolean logic high value or a Boolean logic low value by comparing the given signal to the average voltage level of the first plurality of signals.

12. The method as recited in claim 9, further comprising receiving, by the destination circuitry, the first plurality of signals on an integrating capacitor via a plurality of termination resistors.

13. The method as recited in claim 8, further comprising generating, by the destination circuitry, the data word based on the first sequence of bits.

14. The method as recited in claim 13, wherein:
the data word matches bits used by the source circuitry to generate the first plurality of signals; and
each of the first plurality of signals and the second plurality of signals corresponds to a different accumulative logical disparity.

15. A computing system comprising:
source circuitry configured to:
select a first code word to represent a data word;
convey a first plurality of signals, via a plurality of transmission lines, corresponding to the first code word;
select a second code word to represent the data word, wherein the second code word is different from the first code word; and
convey a second plurality of signals, via the plurality of transmission lines, corresponding to the second code word;
wherein the source circuitry is configured to select at least one of the first code word and the second code word, based at least in part on an accumulative logical disparity.

16. The computing system as recited in claim 15, wherein the first plurality of signals are single-ended data signals on the plurality of transmission lines.

17. The computing system as recited in claim 16, wherein a first voltage level representing a Boolean logic high value for the first plurality of signals is less than a second voltage level representing a Boolean logic high value for the second plurality of signals.

18. The computing system as recited in claim 16, further comprising destination circuitry configured to receive the first plurality of signals on an integrating capacitor via a plurality of termination resistors.

19. The computing system as recited in claim 15, wherein the data word has a number of bits less than a number of bits of the first code word.

* * * * *